(12) United States Patent
Hsu (10) Patent No.: US 7,570,104 B2
(45) Date of Patent: Aug. 4, 2009

(54) CHARGE PUMP CIRCUIT CONTROL SYSTEM

(75) Inventor: Jen Shou Hsu, Hsinchu (TW)

(73) Assignee: Etron Technology, Inc., Hsin Chu (TW)

(*) Notice: Subject to any disclaimer, the term of this patent is extended or adjusted under 35 U.S.C. 154(b) by 37 days.

(21) Appl. No.: 11/797,047

(22) Filed: Apr. 30, 2007

(65) Prior Publication Data
US 2008/0074170 A1 Mar. 27, 2008

(30) Foreign Application Priority Data
Sep. 21, 2006 (TW) .............................. 95134893 A (51) Int. Cl.
*G05F 1/10* (2006.01)
(52) U.S. Cl. .................................. 327/536; 331/57
(58) Field of Classification Search ............ 331/57; 327/536
See application file for complete search history.

(56) References Cited

U.S. PATENT DOCUMENTS

| 5,519,360 A | * | 5/1996 | Keeth ............................. 331/57 |
| 2003/0062948 A1 | * | 4/2003 | Notani et al. ................. 327/544 |
| 2006/0114731 A1 | * | 6/2006 | Park et al. ............... 365/189.09 |
| 2006/0119417 A1 | * | 6/2006 | Hsu et al. ..................... 327/536 |
| 2007/0109059 A1 | * | 5/2007 | Im et al. ......................... 331/57 |
| 2007/0147140 A1 | * | 6/2007 | Byeon et al. ........... 365/189.09 |

* cited by examiner

*Primary Examiner*—Joseph Chang
(74) *Attorney, Agent, or Firm*—Muncy, Geissler, Olds & Lowe, PLLC (57) ABSTRACT

The invention discloses a charge pump circuit control system comprising a level detector, a ring oscillator, and a charge pump circuit. The level detector detects the variation of the output voltage of the charge pump circuit for generating a control signal. The ring oscillator generates a plurality of clock signals according to the control signal, and the charge pump circuit generates the output voltage according to the plurality of clock signals.

18 Claims, 10 Drawing Sheets

CHARGE PUMP CIRCUIT CONTROL SYSTEM

BACKGROUND OF THE INVENTION (a) Field of the Invention

The invention relates to a charge pump circuit, particularly to a charge pump circuit control system.

(b) Brief Description of the Related Art

Figure 1A:
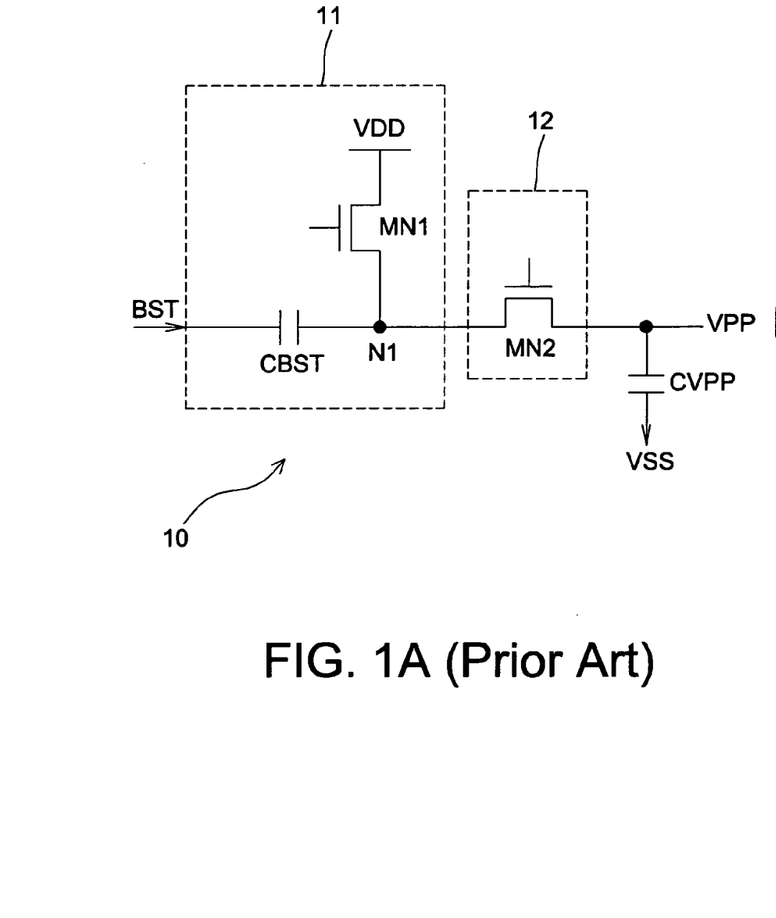
FIG. 1A shows a schematic diagram illustrating the charge pump circuit according to the prior art.
Figure 1B:
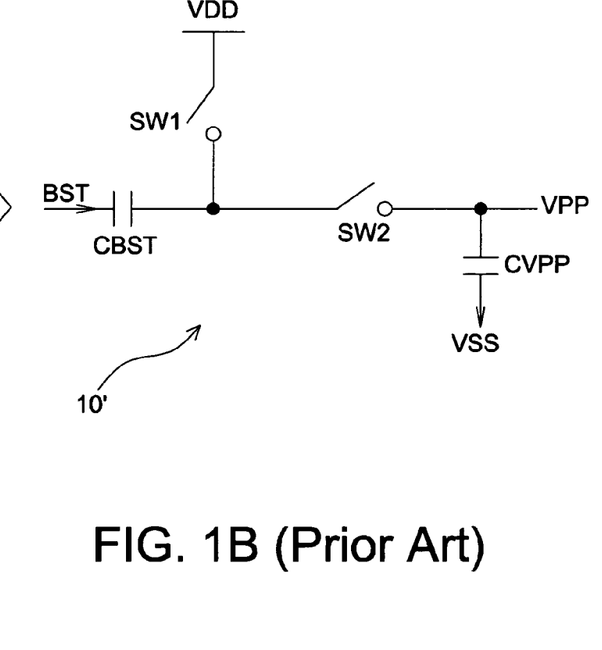
FIG. 1B shows a schematic diagram illustrating the equivalent circuit of the charge pump circuit as shown in FIG. 1A.

FIG. 1A illustrates a traditional charge pump circuit 10. The charge pump circuit 10 comprises a booster 11, a transfer gate 12, and a capacitor CVPP. The booster 11 comprises a capacitor CBST and a MOS transistor MN1. The transfer gate 12 is implemented by a MOS transistor MN2. FIG. 1B illustrates the equivalent circuit 10' of the charge pump circuit 10 where the transistors MN1 and MN2 are represented by equivalent switches SW1 and SW2, respectively. The charge pump circuit 10' operates in three different states, which are the precharge state, the charge sharing state, and the off state. During the precharge state, the switch SW1 is turned on, the switch SW2 is turned off, and the voltage boosting signal BST is at the low voltage level 0 so that the voltage VDD charges the capacitor CBST and the voltage on the node N1 changes from the low voltage level VPP-VDD to the high voltage level VDD. During the charge sharing state, the switch SW1 is turned off, the switch SW2 is turned on, and the voltage boosting signal BST is at the high voltage level VDD (that is the voltage boosting signal BST provides one unit of boosting power) so as to elevate the voltage on the node N1 from VDD to 2 times VDD. The electric charge stored in the capacitor CBST is discharged through the switch SW2 to generate an output voltage VPP and thus the voltage on the node N1 changes from the high voltage level, 2 times VDD, to the low voltage level VPP. During the off state, the switch SW1 is turned off, the switch SW2 is turned off, and the charge pump circuit 10' is idle, that is, the control voltages of MN1 and MN2 remain at the low voltage level to reduce the stress on the oxides of MN1 and MN2 so as to extend the life of the charge pump circuit itself.

Figure 2:
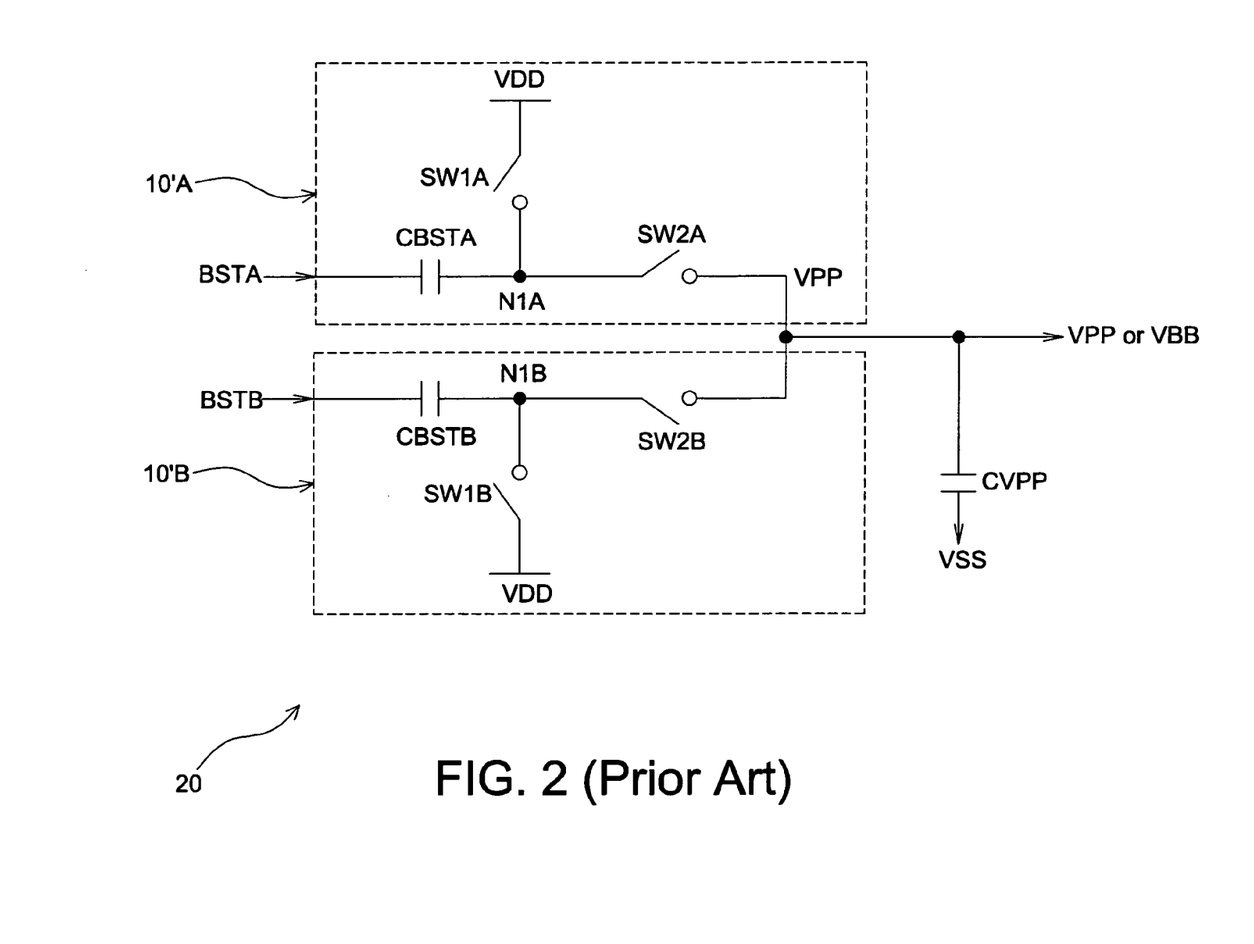
FIG. 2 shows a schematic diagram illustrating the charge pump circuit according to another prior art.

As shown in FIG. 2, in order to reduce the cost of the control circuit, extend the life of the charge pump circuit, and get a more uniform output current, a charge pump circuit 20 is commonly designed to comprise two charge pump circuits 10'A and 10'B cooperating with each other. It can be understood for those who are skilled in the art that the switches SW1A and SW2B share one control signal while the switchs SW1B and SW2A share another control signal. Besides, during circuit operation, the charging and discharging operations are executed simultaneously by the two charge pump circuits 10'A and 10'B to achieve the above mention objectives.

Figure 3A:
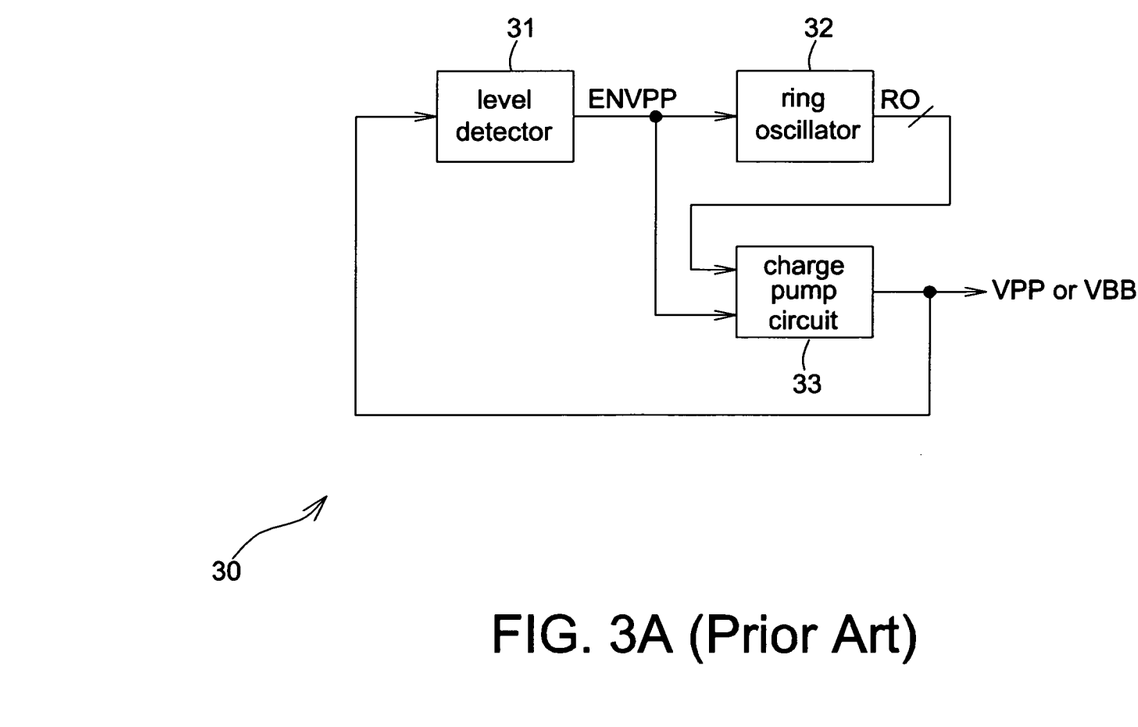
FIG. 3A shows a schematic diagram illustrating the charge pump circuit control system according to the prior art.
Figure 3B:
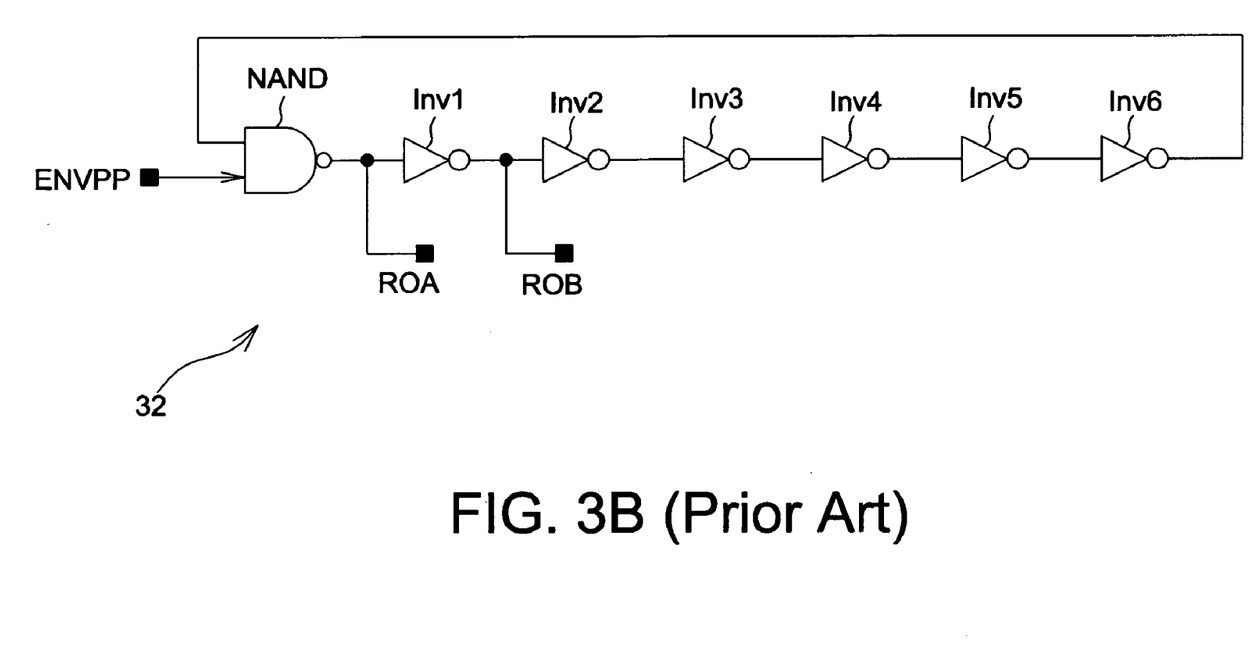
FIG. 3B shows a schematic diagram illustrating the ring oscillator as shown in FIG. 3A.
Figure 3C:
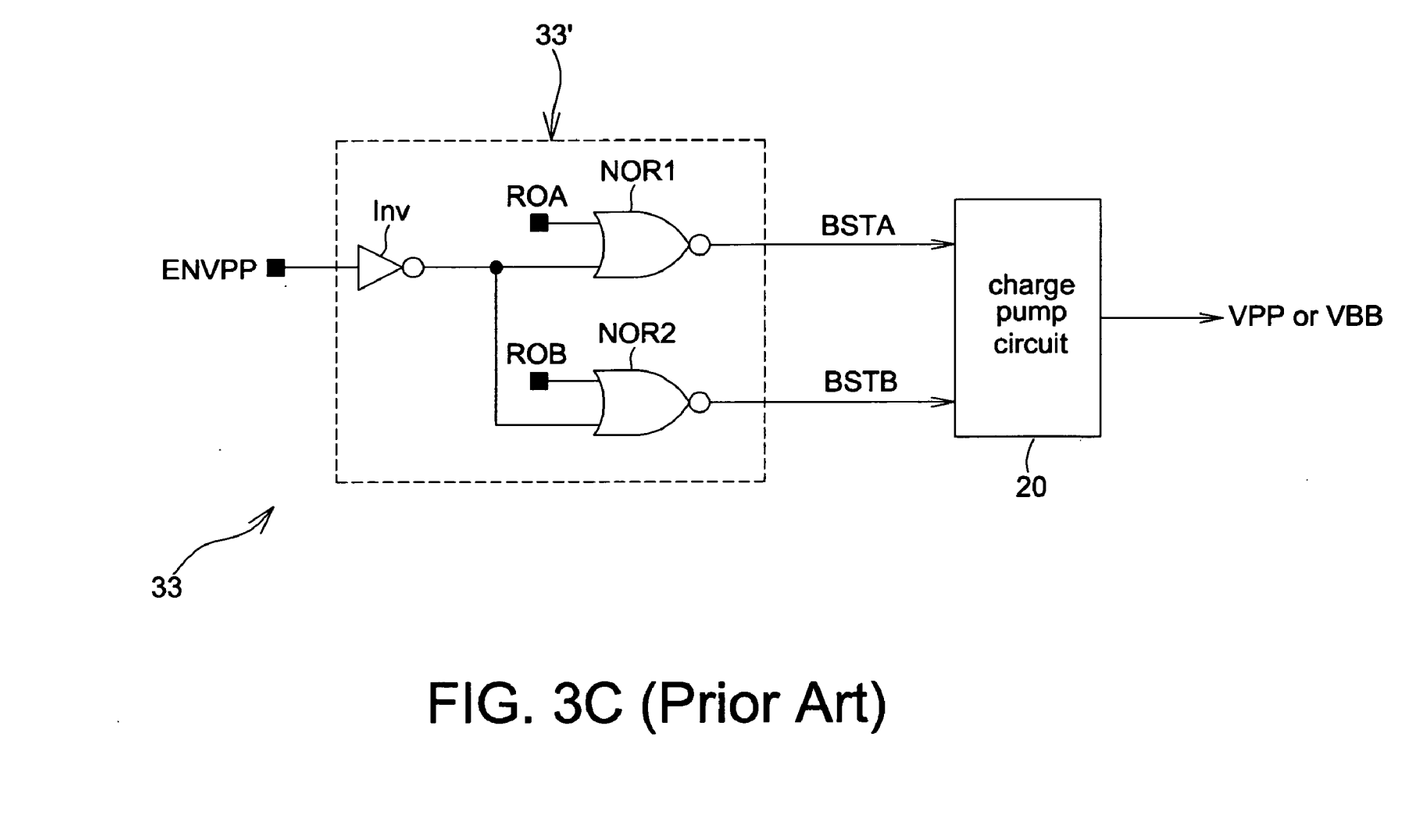
FIG. 3C shows a schematic diagram illustrating the charge pump circuit as shown in FIG. 3A.

FIG. 3A illustrates a traditional charge pump circuit control system 30. The charge pump circuit control system 30 comprises a level detector 31, a ring oscillator 32, and a charge pump circuit 33. FIG. 3B is a schematic diagram illustrating the ring oscillator 32. The ring oscillator 32 comprises a NAND gate NAND and six inverters Inv1~Inv6. FIG. 3C is a schematic diagram illustrating a portion of the control circuit 33' and the charge pump circuit 20 in the charge pump circuit 33. The control circuit 33' comprises an inverter Inv and two NOR gates. The charge pump circuit control system 30 uses the charge pump circuit 20 to output an voltage VPP or VBB with a preset voltage level, uses the level detector 31 to detect the variation of the voltage VPP or VBB, and generates a control signal ENVPP according to the detection result. The ring oscillator 32 receives the control signal ENVPP to generate clock signals RO, such as ROA, ROB and so forth. The control circuit 33' of the charge pump circuit 33 generates boosting signals BSTA and BSTB according to the control signal ENVPP and the clock signals ROA and ROB and uses the boosting signals BSTA and BSTB to control the charging and discharging operations of the charge pump circuit 20 to tune the declined voltage VPP or VBB back to the original preset voltage level.

Figure 3D:
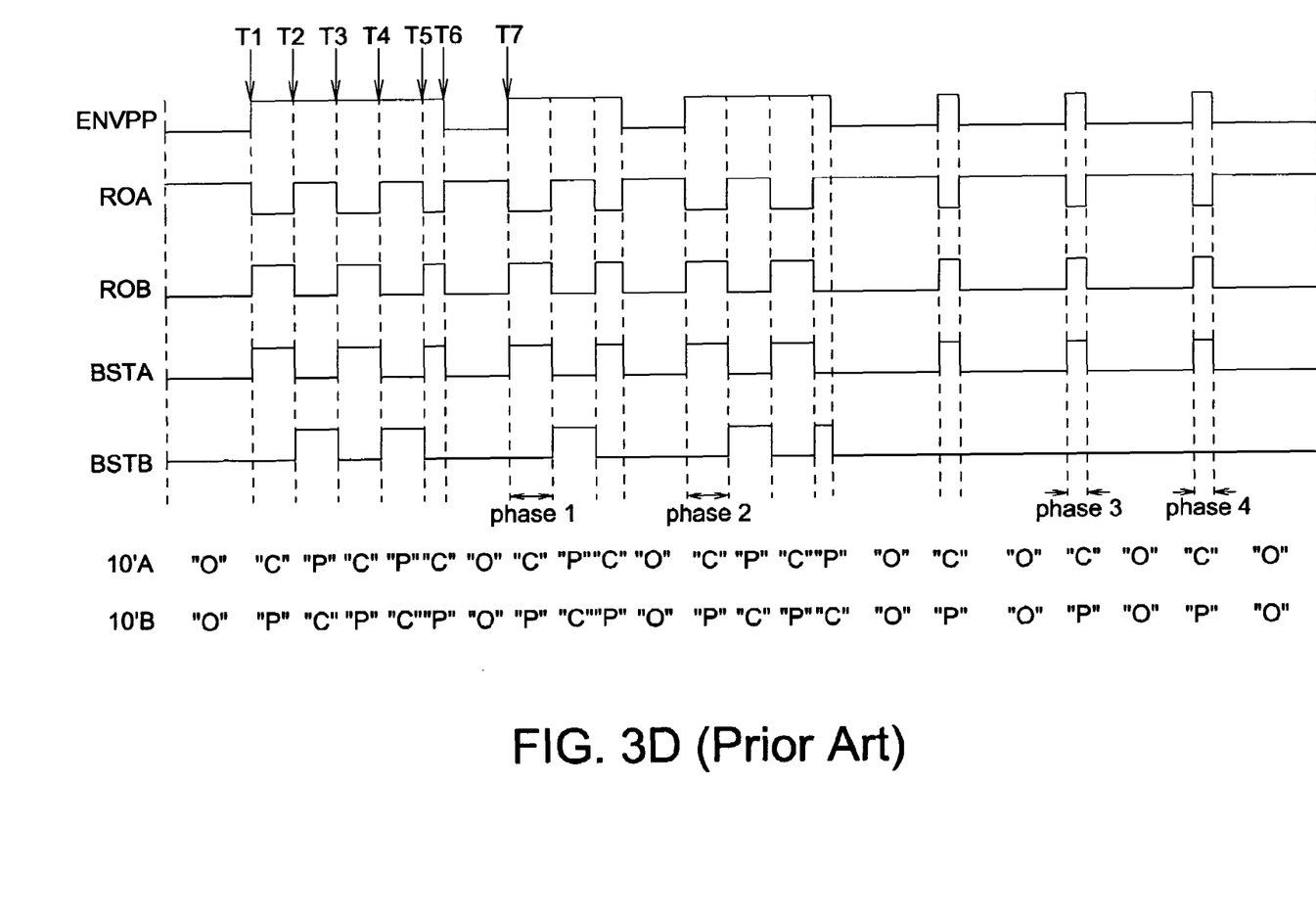
FIG. 3D shows waveform diagrams of the various signals of the charge pump circuit control system as shown in FIG. 3A.

FIG. 3D illustrates the waveforms of the various signals of the charge pump circuit control system 30 during operation, where 10'A and 10'B represent the two charge pump circuits as shown in FIG. 2, "P" indicates that the charge pump circuit 10'A or 10'B is in the precharge state, "C" indicates that the charge pump circuit 10'A or 10'B is in the charge sharing state, and "O" indicates that the charge pump circuit 10'A or 10'B is in the off state. Please refer to FIGS. 2, 3A, 3B, 3C and 3D simultaneously.

At the time T1, as shown in FIG. 3D, the level detector 31 detects that the output voltage VPP or VBB of the charge pump circuit 20 is depleted by the load and thus the VPP or VBB is lower than the preset voltage level. Thus, the level detector 31 enables the control signal ENVPP to the high voltage level 1. The NAND gate of the ring oscillator 32 receives the control signal ENVPP at the high voltage level 1 and then generates the clock signal ROA at the low voltage level 0. In addition, the inverter Inv1 is used to invert the ROA to generate the clock signal ROB at the high voltage level 1. Then, the inverter Inv of the control circuit 33' receives the control signal ENVPP and inverts the voltage level of the control signal ENVPP to the low voltage level 0. The NOR gate NOR1 receives the clock signal ROA at the low voltage level 0 and the control signal ENVPP to generate the boosting signal BSTA at the high voltage level 1. The NOR gate NOR2 receives the clock signal ROB at the high voltage level 1 and the control signal ENVPP at the low voltage level 0 to generate the boosting signal BSTB at the low voltage level 0. Then, the charge pump circuit 10'A receives the boosting signal BSTA at the high voltage level 1 and enters the charge sharing state "C", while the charge pump circuit 10'B receives the boosting signal BSTB at the low voltage level 0 and enters the precharge state "P" to perform the pre-charging/discharging control on the output voltage VPP or VBB.

At the time T2, the clock signal ROA changes to the high voltage level 1 and ROB changes to the low voltage level 0. Correspondingly, the boosting signals BSTA and BSTB change to the low voltage level 0 and the high voltage level 1, respectively, so that the charge pump circuits 10'A and 10'B changes to "P" and "C" states, respectively. Thereafter, the charge pump circuit 20 continuously raises the voltage to the preset voltage level, does not stop until the time T6, and then enters the off state. At the time T7, the output voltage VPP of the charge pump circuit 20 is again depleted by the load so that the control signal ENVPP is enabled and thereby the various components of the charge pump circuit control system 30 then perform the voltage boosting operation again.

As shown by the phase 1 and the phase 2 in FIG. 3D, when the voltage of the control signal ENVPP changes from the low voltage level 0 to the high voltage level 1 (that is, the charge pump circuit changes from the off state to pre-charging/discharging state), the charge pump circuit 10'A repeats the charge sharing "C" operation before the off state "O" once. Thus, the voltage boosting energy of the boosting signal BSTA is wasted. On the other hand, the charge pump circuit 10'B repeats the precharge "P" operation before the off state "O" once. The charged capacitor is charged again and therefore it causes unnecessary energy usage. In addition, as shown by the phase 3 and the phase 4 in FIG. 3D, when the voltage of the control signal ENVPP changes from the low voltage level 0 to the high voltage level 1, the charge pump circuit 10'A repeats the charge sharing "C" operation once, that is, the charge pump circuit 10'A has no additional charge to perform the charge sharing "C" operation during the phase 4. Since the charge pump circuit 10'A has not performed the precharge "P" operation to replenish the depleted charge and the boosting signal BSTA is enabled repeatedly, the boosting energy of the boosting signal BSTA is consumed. On the other hand, the charge pump circuit 10'B performs the precharge "P" operation repeatedly but does not perform the charge sharing "C" operation. Therefore, unnecessary energy is consumed so that the efficiency of the charge pump circuit 20 is equal to zero.

SUMMARY OF THE INVENTION

In light of the above mentioned problem, one object of the invention is to provide a charge pump circuit control system to control the charge pump circuit operation so as to eliminate the repeated operations of the charge pump circuit and avoid the waste of boosting power.

According to one embodiment of the invention, a charge pump circuit control system is provided. The charge pump circuit control system comprises a level detector, a ring oscillator, and a charge pump circuit. The level detector detects the voltage level variation of the output voltage of the charge pump circuit to generate a control signal according to the variation. Then, the ring oscillator generates a plurality of clock signals according to the state of the control signal. The charge pump circuit generates the output voltage according to the plurality of clock signals. The control signal generated by the level detector is not used to control the charge pump circuit directly but is sent to the ring oscillator to generate the plurality of clock signals. These clock signals are thus used to control the operation of the charge pump circuit.

A latch is designed in the ring oscillator of the charge pump circuit control system according to the invention and a corresponding logic gate unit is designed according to the action of the latch. When the voltage level of the control signal of the level detector changes, the charge pump circuit control system uses the latch to latch a voltage signal of a latching node of the ring oscillator and performs charging/discharging control of the charge pump circuit in coordination with the logic gate unit. By such design, the charge pump circuit will not repeatedly execute the same precharge operation or charge sharing operation when it enters the pre-charging/discharging state from the off state. The charge pump circuit follows the operation pattern of "executing charge sharing once after one precharging operation without exception" to thereby eliminate unnecessary electrical energy usage.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

Figure 4A:
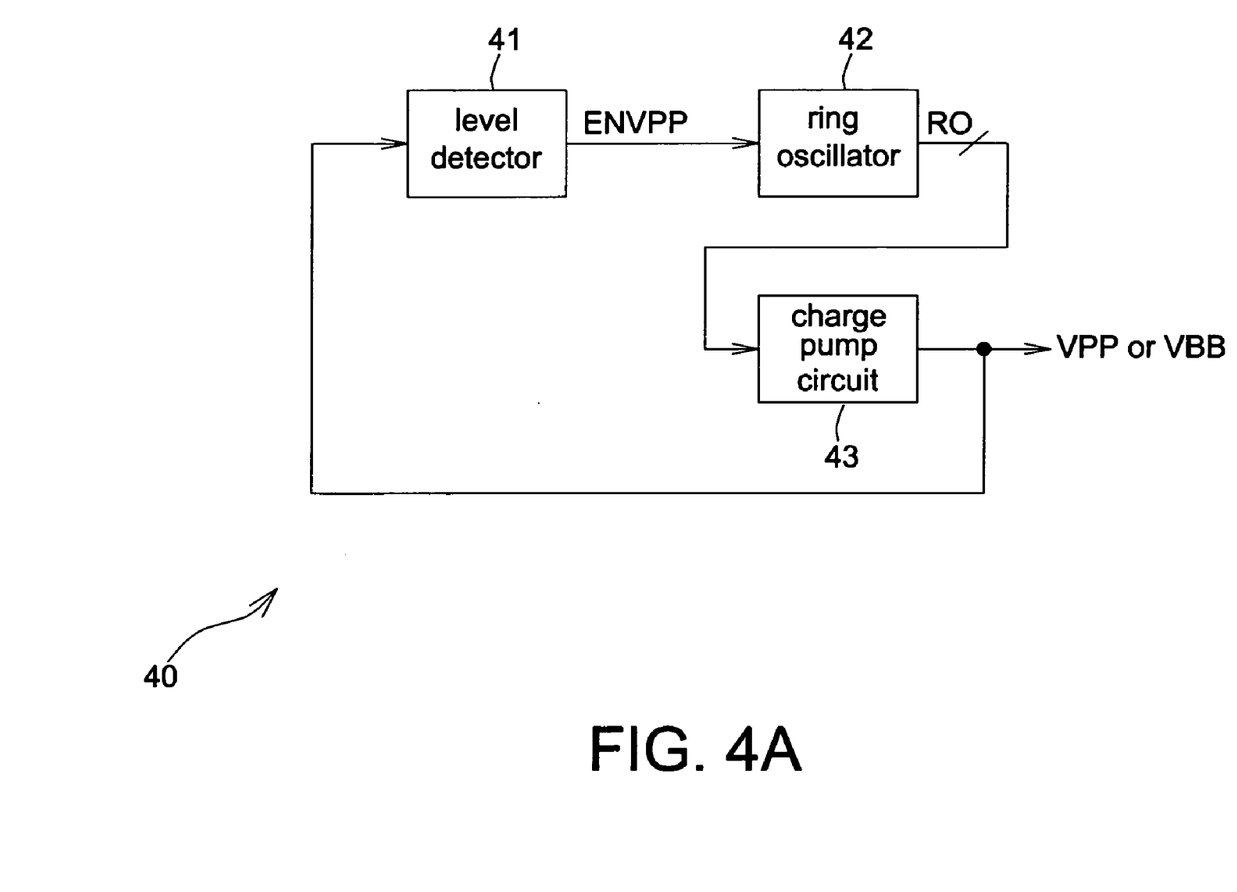
FIG. 4A shows a schematic diagram illustrating a charge pump circuit control system according to one embodiment of the invention.

FIG. 4A shows a schematic diagram illustrating a charge pump circuit control system according to one embodiment of the invention. The charge pump circuit control system 40 comprises a level detector 41, a ring oscillator 42, and a charge pump circuit 43.

The level detector 41 detects the voltage level variation of the output voltage VPP or VBB at a preset voltage level generated by the charge pump circuit 43 to generate a corresponding control signal ENVPP according to the variation. The ring oscillator 42 receives the control signal ENVPP and then generates a plurality of clock signals RO (such as RO0, RO1, and so forth) according to the voltage level of the control signal ENVPP. The charge pump circuit 43 receives the plurality of clock signals RO to generate the output voltage VPP or VBB according to the control of the clock signals RO. It should be noted that the difference between the charge pump circuit control system 40 according to the invention and the traditional charge pump circuit control system 30 is that the level detector 41 of the charge pump circuit control system 40 generates the control signal ENVPP that does not directly control the charge pump circuit 43 but outputs the control signal ENVPP to the ring oscillator 42 to generate a plurality of clock signals RO, through which the operation of the charge pump circuit 43 is controlled.

Figure 4B:
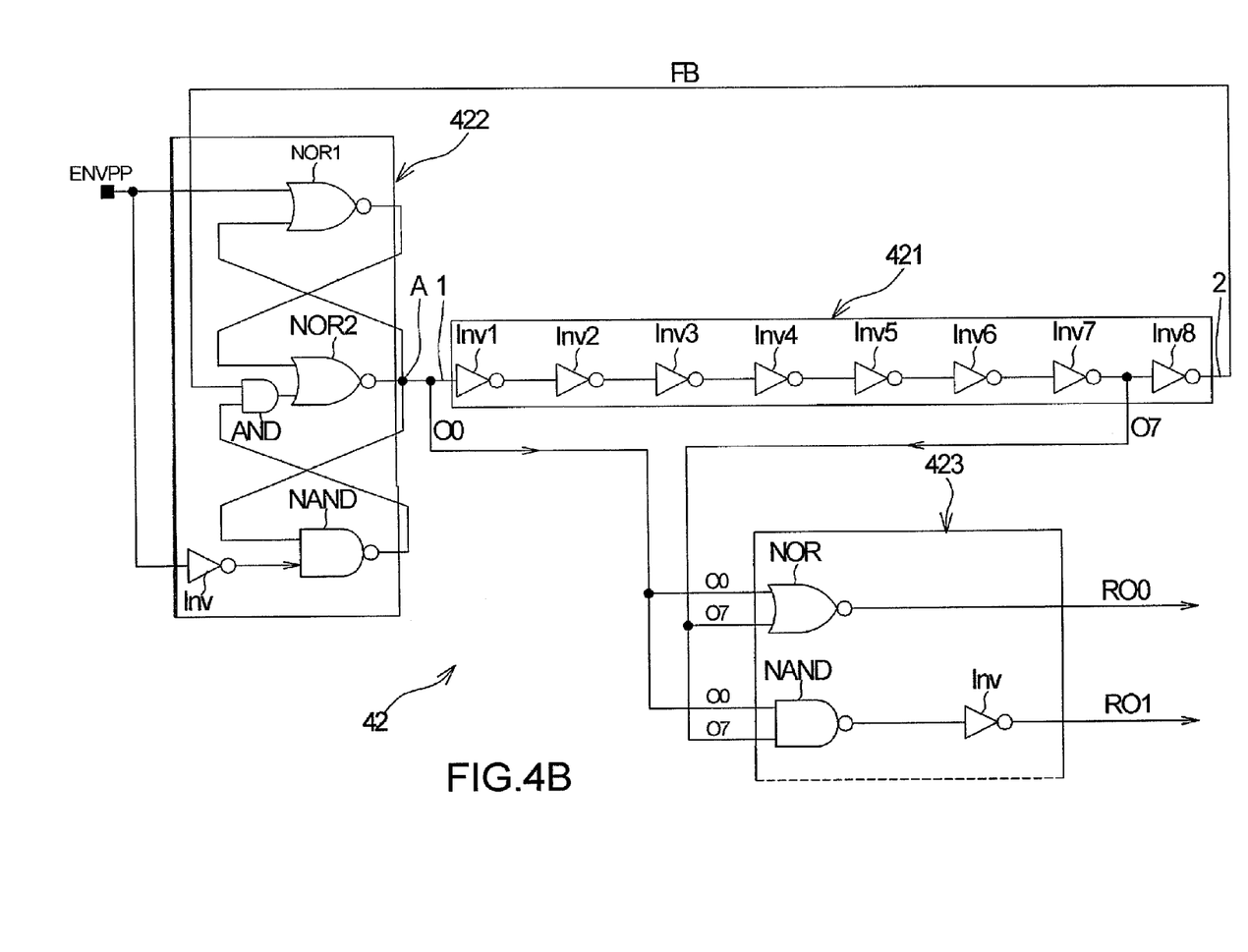
FIG. 4B shows a schematic diagram illustrating a ring oscillator according to one embodiment of the invention.

FIG. 4B shows a schematic diagram illustrating a ring oscillator 42 according to one embodiment of the invention. The ring oscillator 42 comprises a plurality of serial connected inverters 421, a latch 422, and a logic gate unit 423. The serial connected inverters 421 comprise eight inverters Inv1~Inv8. A first terminal 1 of the serial connected inverters 421 is coupled to a latching node A for receiving the voltage of the latching node A and after performing oscillation process, a second terminal of the serial connected inverters 421 generates a feedback signal FB. The serial connected inverters 421 according to one embodiment of the invention further generate a first output signal O0 from the input terminal (the first terminal 1) of the inverter Inv1. A second output signal O7 is generated from the output terminal of the inverter Inv7. It should be noted that output signal O0 or O7 can be generated at the input or output terminal of any inverter of the serial connected inverters 421 and the above mentioned signal O0 or O7 generated from the inverter Inv1 and inverter Inv7 is only an example and can be generated from other inverters in other embodiments of the invention. Furthermore, there are no limitation on the number of inverters in the serial connected inverters 421 and the number of generated outputs O, that depend on the requirements of the actual circuit design and can be any even positive number.

The latch 422 is coupled to the latching node A for performing latching operation on a voltage signal on the latching node A according to the control signal ENVPP and the feedback signal FB. In the embodiment of the invention, the latch 422 latches on the voltage signal generated on the latching node A when the control signal ENVPP is at the low voltage level 0. For instance, when the control signal ENVPP changes from the high voltage level 1 to the low voltage level 0, if the voltage signal level on the latching node A is at 0, the latch 422 latches the voltage signal level of the latching node A at the voltage level 0 and the voltage signal level remains latched until the control signal ENVPP changes from the low voltage level 0 to the high voltage level 1 and then is unlatched. On the other hand, when the control signal ENVPP is at the high voltage level 1, the latch 422 changes the level of the voltage signal of the latching node A periodically and the latch 422 determines the length of the period according to the feedback signal FB. Obviously, in another embodiment of the invention, the latch 422 can be designed to perform the same operation according to the reversed state of the above mentioned voltage level. Furthermore, the latch 422 of the embodiment of the invention is implemented by an inverter Inv, two NOR gates NOR1 and NOR2, an AND gate AND, and a NAND gate NAND. Obviously, other circuits with the same logic function can be implemented in other embodiments of the invention.

The logic gate unit 423 generates a plurality of clock signals RO according to the first output signal O0 and the second output signal O7. In the embodiment of the invention, the logic gate unit 423 is implemented by a NOR gate NOR, a NAND gate NAND, and an inverter Inv. Obviously, other circuits with the same logic function can be implemented in other embodiments of the invention. In the embodiment of the invention, the NOR gate NOR of the logic gate unit 423 receives the first output signal O0 and the second output signal O7 to generate a first clock signal RO0 according to the output signals O0 and O7. The NAND gate NAND of the logic gate unit 423 receives the first output signal O0 and the second output signal O7. A second clock signal RO1 is outputted through the inverter Inv connected in series with the NAND gate NAND.

Figure 4C:
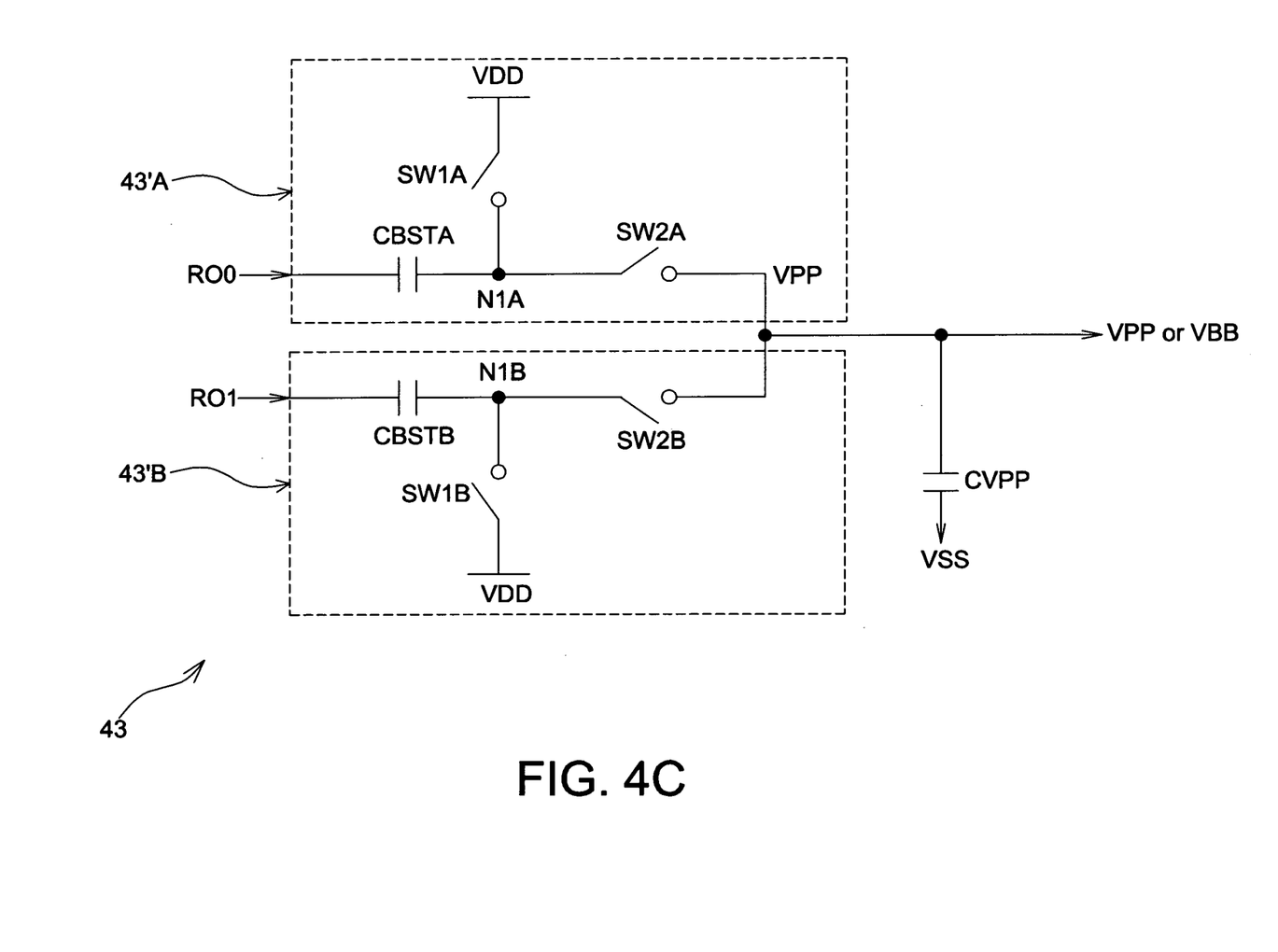
FIG. 4C shows a schematic diagram illustrating a charge pump circuit according to one embodiment of the invention.

FIG. 4C shows a schematic diagram illustrating a charge pump circuit according to one embodiment of the invention. The charge pump circuit 43 of the embodiment of the invention comprises a charge pump circuit 43'A shown in the upper part of FIG. 4C and a charge pump circuit 43'B shown in the lower part of FIG. 4C. The charge pump circuit 43 is implemented by the double times voltage charge pump circuit shown in FIG. 2. The charge pump circuit 43 generates and controls the voltage level of the output voltage VPP or VBB according to the first and the second clock signals RO0 and RO1.

Figure 4D:
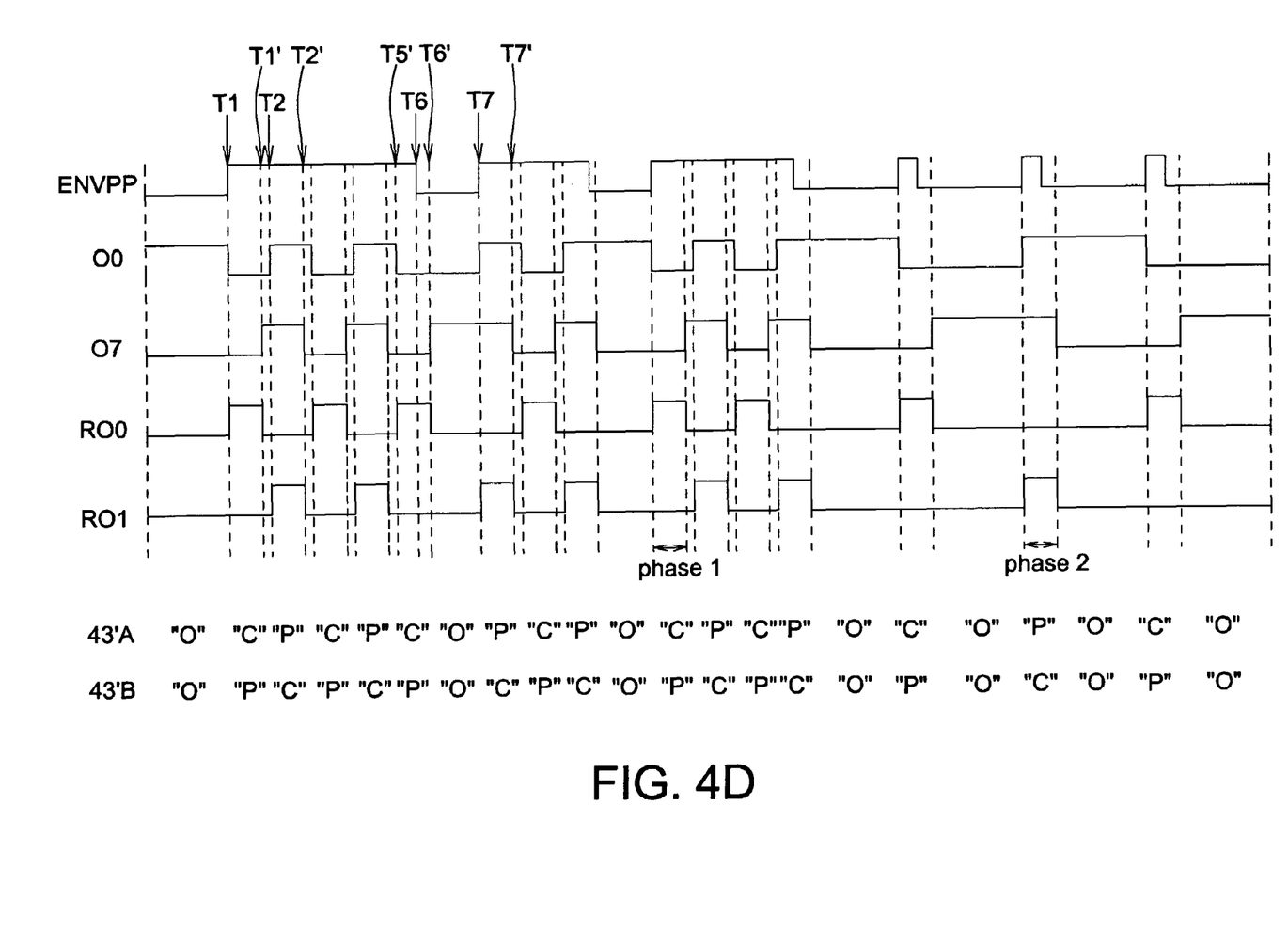
FIG. 4D shows waveform diagrams of the various signals in an operation example of the charge pump circuit control system according to one embodiment of the invention.

FIG. 4D shows waveform diagrams of the various signals of the charge pump circuit control system in an operation example according to one embodiment of the invention. The labels "43'A" and "43'B" shown in the figure are the two charge pump circuits in the charge pump circuit 43 where "P" indicates that the charge pump circuit 43'A or 43'B is in the precharge state, "C" indicates the charge pump circuit 43'A or 43'B is in the charge sharing state, "O" indicates that the charge pump circuit 43'A or 43'B is in the off state.

Please refer to FIGS. 4A, 4B, 4C, and 4D simultaneously. At the time T1, as shown in FIG. 4D, the level detector 41 detects that the output voltage VPP or VBB of the charge pump circuit 43 is depleted by the load and the VPP or VBB is lower than the preset voltage level. Hence, the level detector 41 enables the control signal ENVPP, that is, the voltage level of the control signal ENVPP is converted from 0 to 1. It should be noted that the latch 422 does not perform latching on the latching node A and the latch 422 works like an inverter, when the voltage level of the control signal ENVPP is at the high voltage level 1. Thus, at the time T1, the first output signal O0 generated by the serial connected inverters 421 is inverted from the high voltage level 1 to the low voltage level 0. However, due to the propagation delay effect of the inverters Inv1~Inv7, the second output signal O7 remains at the voltage level 0, at T1. The two input terminals of the NOR gate NOR and the NAND gate NAND of the logic gate unit 423 both receive the voltage level 0. Thus, the first clock signal RO0 becomes the high voltage level 1 after logic processing so that the charge pump circuit 43'A enters the charge sharing state "C". On the other hand, the second clock signal RO1 is at the low voltage level 0 so that the charge pump circuit 43'B enters the precharge state "P". Therefore, the voltage level control of the output voltage VPP or VBB of the charge pump circuit 43 can be carried out.

Then, at the time T1', due to the propagation delay effect of the inverters Inv1~Inv7, the second output signal O7 starts being converted to the high voltage level 1. At the time T2, the first output signal O0 is also converted to the high voltage level 1. Hence, during the overlap time of the output signals O7 and O0, that is, between the time T2 and T2', as shown in FIG. 4D, the clock signals RO0 and RO1 change into the low voltage level 0 and the high voltage level 1, respectively. Consequently, the charge pump circuits 43'A and 43'B change to the "P" and "C" state, respectively. Then, the charge pump circuit control system 40 continuously raises the output voltage VPP or VBB of the charge pump circuit 43 to the preset voltage level until the time T6 and then stops. It should be noted that, at the time T6, the control signal ENVPP is converted from the high voltage level 1 to the low voltage level 0 and thus the latch 422 becomes in operation and latches on the first output signal O0 at the time T6 so that the voltage signal of the latching node A shown in FIG. 4B is latched at the low voltage level 0. In additional, due to the delay effect of the inverters Inv1~Inv7, the conversion from the low voltage level 0 to the high voltage level 1 for the second output signal O7 is delayed until the time T6'. Thus, between the time T5' and T6', the clock signals RO0 and RO1 are at the voltage level 1 and 0, respectively. Thereby, the charge pump circuits 43'A and 43'B can continue to finish the charge sharing "C" and the precharge "P" operations respectively after the control signal ENVPP is disabled (becomes the low voltage level 0) and do not enter the off state "O" directly, like the charge pump circuit control system 30 according to the prior art that stops the precharging/discharging operation completely at the time T6.

During the time interval T6'~T7, the charge pump circuits 43'A and 43'B are both in the off state "O" and the level of the output voltage VPP or VBB of the charge pump circuit 43 is raised to above the preset voltage level.

Until the time T7, the output voltage VPP or VBB of the charge pump circuit 43 is again depleted by the load and the level detector 41 enables the control signal ENVPP to the high voltage level 1. Therefore, the latch 422 unlatches the voltage signal of the latching node A according to the control signal ENVPP and thereby the latch 422 is now equivalent to an inverter. Hence, the voltage level of the first output signal O0 is inverted from 0 to 1. Due to the propagation delay effect of the inverters Inv1~Inv7, the voltage level of the second output signal O7 remains at the high voltage level 1 until the time T7'. Therefore, between the time interval T7~T7', the voltage level of the clock signals RO0 and RO1 are at 0 and 1, respectively. Hence, the charge pump circuits 43'A and 43'B are in the precharge state "P" and the charge sharing state "C", respectively. If the charge pump circuit is in the precharge state "P" before the off state "O", the charge pump circuit control system 40 according to the invention has the charge pump circuit enter the charge sharing state "C" when the charge pump enter the precharge state "P" from the off state "O", or vice versa. By the same proof, during the phase 1 as shown in FIG. 4D, when the voltage level of the control signal ENVPP changes from 0 to 1, the charge pump circuit 43'A enters the previous charge sharing state "C" that is opposite to the state before the off state "O" and the charge pump circuit 43'B enters the precharge state "P" that is opposite to the state before the off state "O". Or, during the phase 2, as shown in FIG. 4D, when the level detector 41 generates a glitch due to noise interference so that the voltage of the control signal ENVPP changes from 0 to 1 instantaneously, the charge pump circuit 43'A enters the precharge state "P" that is different from the state before the off state "O" and the charge pump circuit 43'B enters the charge sharing state "C" that is different from the state before the off state "O". Through such mechanism, when the level detector 41 experiences noise interference, the interference energy can be released so that the circuit does not become idle to waste energy due to such interference (for example, from the phase 3 to phase 4 shown in FIG. 3D according to the prior art).

In conclusion, when the charge pump circuit control system controls the operation of the charge pump circuit according to one embodiment of the invention, the operation pattern of executing charge sharing "C" once after one precharging "P" operation without exception is followed. Unlike the prior art, the same operations are not repeated and the boosting power of the charge pump circuit is not wasted. Therefore, the problems in the prior art are solved. Furthermore, as can be seen in the waveforms of the first and the second clock signals RO0 and RO1 shown in FIG. 4D, by the mechanism of the embodiment of the invention, every enabling interval of the first clock signal RO0 is the same (or almost the same), every enabling interval of the second clock signal RO1 is the same (or almost the same), and the enabling interevals of the two clock signals RO0 and RO1 are interlaced. Thus, the charge pump circuit control system according to the embodiment of the invention has the charge pump circuit accurately and evenly precharge/discharge without any malfunction.

Furthermore, the charge pump circuit control system 40 according to the embodiment of the invention controls a double times voltage pumped system. Obviously, for those who are skilled in the art, the charge pump circuit control system 40 can be modified to control a multiple times voltage pumped system without departing from the scope of the present invention.

Although the present invention has been fully described by way of examples with reference to the accompanying drawings, it should not construe any limitations on the scope of the present invention, various modifications and changes can be made by those who are skilled in the art without deviating from the essence of the invention.

What is claimed is:
1. A charge pump circuit control system, comprising:
   a charge pump circuit for generating an output voltage;
   a level detector for detecting the output voltage variation and thereby generating a control signal; and
   a ring oscillator for generating a plurality of clock signals according to the control signal, comprising:
   a latching node;
   a plurality of serial connected inverters for generating a first output signal and a second output signal wherein a first terminal of the plurality of serial connected inverters is coupled to the latching node and a second terminal of the plurality of serial connected inverters is to generate a feedback signal;
   a latch coupled to the latching node for performing latching operation on a voltage signal of the latching node according to the control signal and the feedback signal; and
   a logic gate unit for generating the plurality of clock signals according to the first output signal and the second output signal;
   wherein the charge pump circuit generates the output signal according to the plurality of clock signals and every enabling interval of a first clock signal in the plurality of clock signals is the same.

2. The charge pump circuit control system according to claim 1, wherein the plurality of clock signals comprise a second clock signal, every enabling interval of the second clock signal is the same, and the enabling interval of the first clock is interlaced with the enabling interval of the second clock.

3. The charge pump circuit control system according to claim 1, wherein the plurality of serial connected inverters comprise a first inverter and a second inverter, the first output signal is generated by the input terminal of the first inverter, and the second output signal is generated by the input terminal of the second inverter.

4. The charge pump circuit control system according to claim 1, wherein the plurality of serial connected inverters comprise a first inverter and a second inverter, the first output signal is generated by the input terminal of the first inverter, and the second output signal is generated by the output terminal of the second inverter.

5. The charge pump circuit control system according to claim 1, wherein the latch performs latching operation on the voltage signal of the latching node when the control signal is at a first voltage level and the latch periodically changes the voltage level of the voltage signal of the latching node when the control signal is at a second voltage level.

6. The charge pump circuit control system according to claim 5, wherein the latch determines the length of the period according to the feedback signal.

7. The charge pump circuit control system according to claim 1, wherein the logic gate unit comprises:
   a NOR gate for generating the first clock signal according to the first output signal and the second output signal; and
   a NAND gate and an inverter serial coupled to the NAND gate wherein the NAND gate receives the first output signal and the second output signal and the inverter outputs the second clock signal.

8. The charge pump circuit control system according to claim 2, wherein the charge pump circuit is a double times voltage pumped system or a multiple times voltage pumped system.

9. A ring oscillator for charge pump circuit, comprising:
   a latching node;
   a plurality of serial connected inverters for generating a first output signal and a second output signal wherein a first terminal of the plurality of serial connected inverters is coupled to the latching node and a second terminal of the plurality of serial connected inverters is to generate a feedback signal;

a logic gate unit for generating a plurality of clock signals according to the first output signal and the second output signal in which every enabling interval of a first clock signal in the plurality of clock signals is the same; and a latch coupled to the latching node for performing latching operation on a voltage signal of the latching node according to the control signal and the feedback signal;

wherein the latch performs latching operation on the voltage signal of the latching node when the control signal is at a first voltage level and the latch periodically changes the voltage level of the voltage signal of the latching node when the control signal is at a second voltage level.

10. The ring oscillator according to claim 9, wherein the latch determines the length of the period according to the feedback signal.

11. The ring oscillator according to claim 9, wherein the plurality of serial connected inverters comprise a first inverter and a second inverter, the first output signal is generated by the input terminal of the first inverter, and the second output signal is generated by the input terminal of the second inverter.

12. The ring oscillator according to claim 9, wherein the plurality of serial connected inverters comprise a first inverter and a second inverter, the first output signal is generated by the input terminal of the first inverter, and the second output signal is generated by the output terminal of the second inverter.

13. The ring oscillator according to claim 9, wherein the plurality of clock signals comprise a second clock signal, every enabling interval of the second clock signal is the same, and the enabling interval of the first clock signal is interlaced with the enabling interval of the second clock signal.

14. The ring oscillator according to claim 13, wherein the logic gate unit comprises:

a NOR gate for generating the first clock signal according to the first output signal and the second output signal;

a NAND gate and an inverter serial coupled to the NAND gate wherein the NAND gate receives the first output signal and the second output signal and the inverter outputs the second clock signal.

15. A charge pump circuit control system, comprising:

a charge pump circuit for generating an output voltage;

a level detector for detecting the output voltage variation and thereby generating a control signal; and a ring oscillator for generating at least two clock signals according to the control signal;

wherein the charge pump circuit generates the output signal according to logic results of the at least two clock signals and each enabling interval of the at least two clock signals is substantially the same and interlaced.

16. The charge pump circuit control system according to claim 15, wherein the charge pump circuit is a double times voltage pumped system or a multiple times voltage pumped system.

17. A ring oscillator for charge pump circuit, comprising:

a latching node;

a plurality of serial connected inverters for generating a first output signal and a second output signal wherein a first terminal of the plurality of serial connected inverters is coupled to the latching node and a second terminal of the plurality of serial connected inverters is to generate a feedback signal;

a logic gate unit for generating the plurality of clock signals according to the first output signal and the second output signal; and a latch coupled to the latching node for performing latching operation on a voltage signal of the latching node according to the control signal and the feedback signal;

wherein the latch performs latching operation on the voltage signal of the latching node when the control signal is at a first voltage level and the latch periodically changes the voltage level of the voltage signal of the latching node when the control signal is at a second voltage level.

18. The ring oscillator according to claim 17, wherein the plurality of serial connected inverters comprise a first inverter and a second inverter, the first output signal is generated by the input terminal of the first inverter, and the second output signal is generated by the input terminal or the output terminal of the second inverter.

* * * * *